Figure 1:
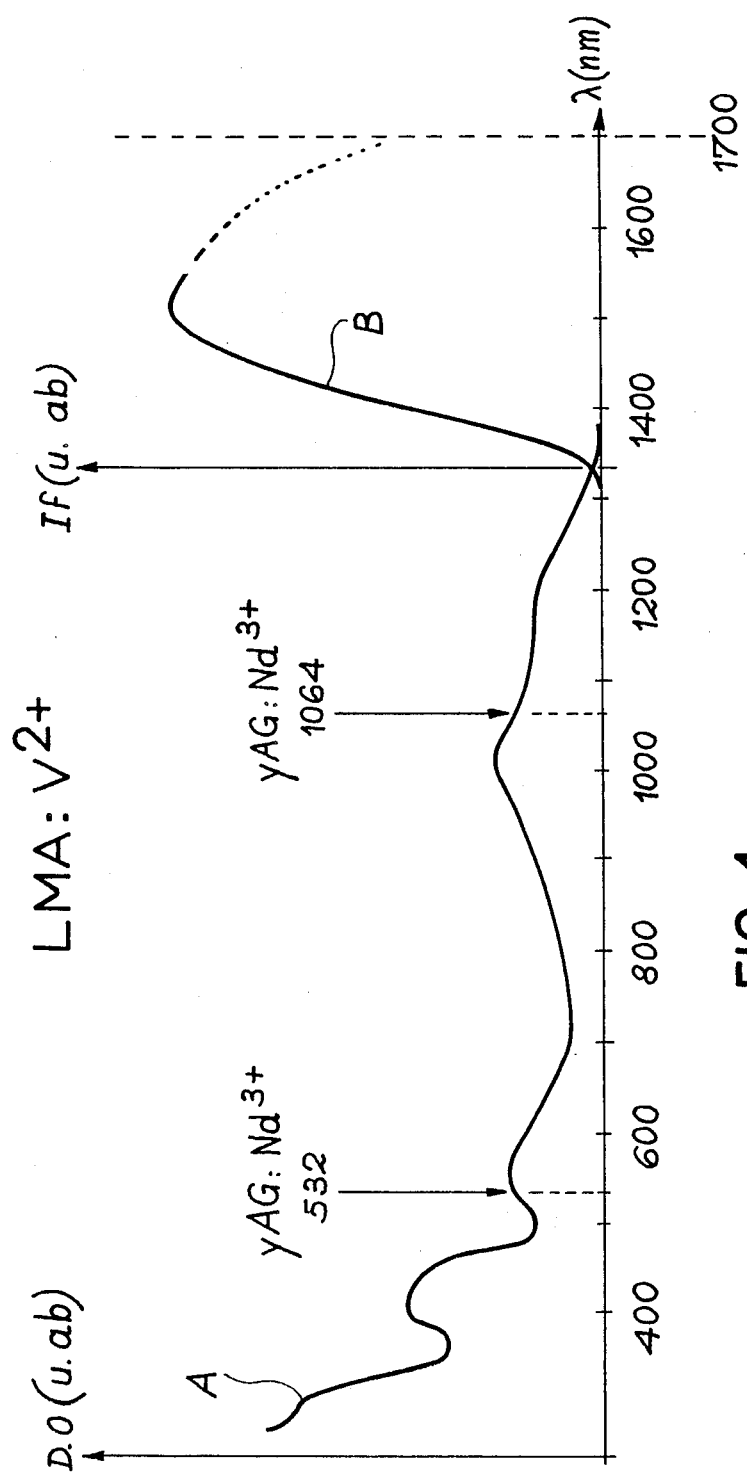

United States Patent [19]

Calvat et al.

[11] Patent Number: 4,853,354
[45] Date of Patent: * Aug. 1, 1989

[54] MIXED LANTHANUM-MAGNESIUM ALUMINATES AND LASERS USING MONOCRYSTALS OF THESE ALUMINATES

[75] Inventors: Claude Calvat, Saint Egreve; Laurent Colle, Paris; Maurice Couchaud, Seyssinet-Pariset; Anne-Marie LeJus, Montrouge; Richard Moncorge, Trevoux; Daniel Vivien, Garches; Christophe Wyon, Saint Egreve, all of France

[73] Assignee: Commissariat A L'Energie Atomique Center National De La Recherche Scientifique, both of Paris, France

[*] Notice: The portion of the term of this patent subsequent to Aug. 19, 2003 has been disclaimed.

[21] Appl. No.: 128,772

[22] Filed: Dec. 4, 1987

[30] Foreign Application Priority Data

Dec. 5, 1986 [FR] France ............... 8617082

[51] Int. Cl.$^4$ ............................. C04B 35/02
[52] U.S. Cl. ..................... 501/119; 501/123; 501/127; 501/132; 501/152; 501/153; 156/DIG. 63; 252/301.4 R
[58] Field of Search ............... 156/DIG. 63; 501/119, 501/118, 123, 132, 152, 127, 153; 252/301.4 R

[56] References Cited

U.S. PATENT DOCUMENTS 4,606,846  8/1986  Kahn et al. ............... 156/DIG. 63

FOREIGN PATENT DOCUMENTS 043776  1/1982  European Pat. Off. .
43776   1/1982  France .

Primary Examiner—William R. Dixon, Jr.
Assistant Examiner—Andrew Griffis
Attorney, Agent, or Firm—Michael N. Meller

[57] ABSTRACT

These lasers in particular have two flashlamps (30, 32) for longitudinally pumping a monocrystalline aluminate bar (28) emitting in the visible and near infrared, two mirrors (38, 40) for amplifying the light emitted by the bath, a polarizer prism (42) used for feeding the amplified light beam to the outside of the laser cavity. The magnetoplumbite-type aluminate has in particular the formula:

$$La_{1-x}Mg_{1-y-z}Mt_vAl_{11+x+2y/3-v}O_{19-z} \qquad (II)$$

in which Mt represents a transition metal chosen from titanium and zirconium; x is a number such that $0 < x < 0.3$; y and z are numbers such that $0 \leq y + z \leq 1$ with $0 \leq y \leq 1$ and $0 \leq z \leq 1$; v is a number such that $0 < v < 1$.

11 Claims, 4 Drawing Sheets

MIXED LANTHANUM-MAGNESIUM ALUMINATES AND LASERS USING MONOCRYSTALS OF THESE ALUMINATES

DESCRIPTION

The present invention relates to mixed lanthanum-magnesium aluminates having the structure of the magnetoplumbite and in particular obtained in the form of monocrystals.

It is more particularly used in the field of microlasers tunable in the near infrared between 1380 and 1800 nm, usable for integrated optics, fibre optics telecommunications, medicine (microsurgery, skin treatment) and for studying semiconductors, as well as in the field of tunable power lasers emitted in the visible and very near infrared, particularly between 6000 and 1000 nm for the remote analysis of the stratosphere, space communications, observations of the earth's crust, etc.

These lasers can also be used for carrying out material treatments (welding, drilling, marking, surface treatment), photochemical reactions, controlled thermonuclear fusion or the polarization of the atoms of a gas, such as helium.

Known mixed aluminium oxides are in particular mixed lanthanum-neodymium-magnesium aluminates of the magnetoplumbite type, called LNA and of chemical formula $La_{1-x}Nd_xMgAl_{11}O_{19}$ with $0 < x \leq 1$ and in particular of formula $La_{0.9}Nd_{0.1}MgAl_{11}O_{19}$. These mixed aluminates form the subject matter of FR-A-2 448 134 and EP-A-0 043 776 filed in the name of one of the Applicants.

These mixed aluminates obtained in the form of monocrystals are particularly suitable as laser emitters emitting in the infrared. They have optical properties comparable to those of the yttrium and aluminium garnet, in which 1% of the yttrium ions is replaced by neodymium ions and known under the abbreviation $YAG:Nd^{3+}$ and which also has neodymium ultraphosphate ($NdP_5O_{14}$).

In particular, LNA has very interesting laser emission wavelengths at 1054 and 1082 nm surrounding that of YAG at 1064 nm. It also has another emission wavelength range around 1320 nm, which corresponds to the smallest attenuation by silica optical fibres, thus permitting the optical fibre transmission of maximum information with minimum loss.

However, the production of these aluminates in the form of monocrystals and in particular by the most widely used Czochralski method leads to crystals having an inadequate quality (bubbles, defects), as soon as it is necessary to obtain the large sizes required by the laser industry and more particularly for power lasers (diameter 6.35 and length 100 mm bar). The laser emission wavelengths of LNA are in limited numbers and only have a limited tunability (a few nanometers).

Another known aluminium oxide is titanium-doped alumina $Al_2O_3:Ti^{+3}$. This material, which emits in the visible and very near infrared and more specifically between 650 and 1000 nm is generally used in tunable power lasers.

Alumina-titanium has a certain number of disadvantages mainly due to the limited solubility of titanium-(III)oxide ($Ti_2O_3$) in alumina. This leads to crystalline perfection problems with a significant segregation during the pulling of the monocrystals, which do not have the same composition as the molten bath. Moreover, there is a high gradient of the titanium concentration, the titanium concentration being e.g. much smaller in the centre of the monocrystal than at its periphery, particularly when obtained on the basis of the Verneuil method. Finally there is a risk of the formation of $TiO_2$ microprecipitates during the production of the monocrystals.

The limited solubility of titanium in alumina only allows 0.1% by weight titanium in the alumina, which limits the emitting power of the material.

Moreover, the production of the alumina-titanium in monocrystalline form by the Czochralski method in an irridium crucible leads to rapid crucible wear and therefore to a frequent replacement of the crucibles, which increases the price of the monocrystals, bearing in mind that high melting point of alumina of close to 2050° C. Moreover, this melting point leads to a high energy consumption for producing the pulling bath.

Another known laser material usable in lasers tunable between 700 and 850 nm is zinc and potassium trifluoride ($KZnF_3$) doped with $Cr^{3+}$ ions.

This fluoride-based laser material has a certain number of disadvantages due to its chemical fragility (poor resistance to chemical agents and in particular water), as a result of its physical fragility and its limited hardness, which makes it difficult to cut and polish. However, cutting and polishing are necessary to ensure a good laser effect.

Another known laser material usable in tunable lasers is chromium-doped alexandrite of formula $BeAl_2O_4:Cr^{3+}$ and the scandium and gadolinium garnet GSGG ($Gd_3Sc_2Ga_3O_{12}$) doped with $Cr^{3+}$. These materials are the only ones which at present have a real industrial significance for vibronic lasers emitting between 650 and 900 nm. Vibronic lasers are lasers which are continuously tunable and in which the optical transitions responsible for the laser effect lead to excited vibrational levels of the fundamental electronic state.

In these lasers, the tunable laser effect results from the high interaction between the electronic states of certain luminescent ions, such as transition ions of the iron group (electron configuration $3d^n$), with the vibrations (phonons) of the crystal lattice. The optical spectra are in the form of broad bands and it is these broad bands which are observed in fluorescence which make it possible to obtain a continuous laser tunability in a broad wavelength range.

For further details on tunable lasers involving electron-phonon interactions (or vibronic lasers), reference should be made to the publication "Tunable Solid State Lasers" by P. Hammerlin, A. B. Budgar, A. Pinto, Ed. Stringer Verlag, pub. 1985.

The great interest of these solid state lasers with 3d transition ions is their considerable chemical stability. They are therefore called on to replace dye lasers. Vibronic laser materials based on $Cr^{3+}$ nevertheless suffer from disadvantages due to the absorption of the optical pumping radiation or the laser radiation of the activator ion in one of the excited states of chromium leading to light energy losses which is disadvantageous in connection with the production of power lasers.

The invention is directed at novel mixed lanthanum-magnesium aluminates usable as laser emitters and making it possible to obviate the aforementioned disadvantages.

In particular, these novel aluminates can be produced in the form of large monocrystals and can consequently be used in the industry of power lasers emitting in a wavelength range from the visible to the very near infrared. They also have very good crystalline qualities.

Moreover, these novel aluminates have a melting temperature (approximately 1870° C.) which is below that of alumina, which leads to a reduction by at least half of the consumption of irridium crucibles during pulling by the Czochralski method. Moreover, they cause no problem as regards the cutting and polishing thereof.

More specifically, the invention relates to lanthanum-magnesium aluminates of the magnetoplumbite type in which part of the aluminium is substituted by a transition metal, such as titanium or zirconium, or in which part of the magnesium is substituted by a transition metal, such as vanadium. In both cases, the transition metal constitutes the laser activator of the material.

The aluminates according to the invention have a crystal matrix of type $LaMgAl_{11}O_{19}$. This matrix has a melting point (1870° C.) below that of alumina. Moreover, it has the advantage of being able to accept both divalent and trivalent metal ions, in substitution for part of the $Al^{3+}$ or $Mg^{2+}$ ions, without introducing charge compensation, which simplifies the crystallogenesis of these materials.

This matrix also has the advantage of being rich in octahedral sites accessible to metal cations, which are the only sites which are of interest for tunable lasers. It also has a crystal structure with a hexagonal mesh and mechanical properties close to those of alumina.

The mixed aluminates according to the invention also have, during the growth of the monocrystal, an absence of segregation of constituents making it possible to increase the pulling speed of the monocrystal compared with certain prior art materials. This significantly reduces the monocrystal preparation time, as well as improving the life of the crucibles containing the molten bath.

According to a first feature of the invention, the mixed lanthanum-magnesium aluminates are of formula I:

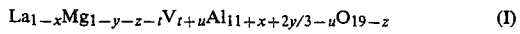

$$La_{1-x}Mg_{1-y-z-t}V_{t+u}Al_{11+x+2y/3-u}O_{19-z} \quad (I)$$

in which x represents a number such that $0<x<0.3$; y, z, t and u represent numbers such that $0<y+z+t\leq 1$ and $0<t+u\leq 1$, with $0\leq y<1$, $0\leq z<1$, $0<t\leq 1$ and $0\leq u<1$; and these aluminates are single-phase and have the structure of the magnetoplumbite.

In these mixed lanthanum-magnesium aluminates, the laser activator is the $V^{2+}$ ions in octahedral symmetry. However, during the production of this aluminate, a certain number of $V^{3+}$ ions can be formed, hence the presence of u in the formula. These $V^{3+}$ ions are considered as impurities. Advantageously u is equal to 0.

According to the invention the vanadium-doped lanthanum-magnesium aluminates, hereinafter designated $LMA:V^{2+}$, can be used as laser emitters in lasers which are continuously tunable between 1380 and 1800 nm. These lasers can in particular be continuously operating power lasers. Preferably the concentration of $V^{2+}$ ions in the aluminate of formula I is such that $0.02\leq t\leq 0.2$.

Advantageously, y, z and t in formula I are such that $0.3\leq y+z+t\leq 0.6$. Preferably, z is equal to 0, which corresponds to a minimum number of oxygen vacencies in the crystal lattice.

According to another major characteristic of the invention, the mixed lanthanum-magnesium aluminates are of the following formula II:

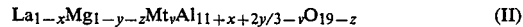

$$La_{1-x}Mg_{1-y-z}Mt_vAl_{11+x+2y/3-v}O_{19-z} \quad (II)$$

in which Mt represents a transition metal chosen from among titanium and zirconium; x represents a number such that $0<x<0.3$; y and z represent numbers such that $0\leq y+z\leq 1$ with $0\leq y\leq 1$ and $0\leq z\leq 1$; and v represents a number such that $0<v\leq 1$; and these aluminates are single-phase and have the structure of the magnetoplumbite.

The matrix of type $LaMgAl_{11}O_{19}$ according to the invention, has, compared with alumina, a greater aptitude for dissolving titanium, thus preventing segregation and a gradient of the concentration of titanium in the matrix. Titanium-doped lanthanum-magnesium Aluminated are hereinafter designated $LMA:Ti^{3+}$.

The use of titanium as the transition metal makes it possible to produce monocrystals usable for the production of lasers continuously tunable between 650 and 1000 nm.

The laser effect is due to the $Ti^{3+}$ ion, which is of particular interest for the production of high power lasers because, unlike most other transition ions usable as a laser activator and in particular chromium, it does not suffer from absorption phenomena in the excited state thereby reducing the laser efficiency, i.e. the ratio of the light energy supplied to the exciting light energy. This is due to the fact that the $Ti^{3+}$ ion only has two energy levels in octahedral symmetry. Moreover, the presence of the $Ti^{3+}$ ion in the matrix permits the tunability of the laser over a wide range.

In the case of the substitution of part of the aluminium by zirconium, element 4d of the same family as titanium, the laser effect is due to the $Zr^{3+}$ ion. Mixed aluminates based on zirconium, hereinafter designated $LMA:Zr^{3+}$ can be used as laser emitters in a continuous wavelength tunability range displaced slightly towards the visible compared with that of $Ti^{3+}$ ions. Advantageously, the quantity of $Zr^{3+}$ or $Ti^{3+}$ ions in the aluminate of formula (II) is such that $0.004\leq v\leq 0.2$.

Preferably, y and z in formula (II) are chosen such that $0.3\leq y+z\leq 0.6$. In particular, z is equal to 0, which corresponds to a minimum number of oxygen vacancies in the crystal lattice.

Advantageously, the lanthanum quantity in the aluminates of formula (I) or (II) according to the invention is such that $0.05\leq x\leq 0.2$.

The laser effect can be obtained with monocrystals of an aluminate according to formula (I) or (II) by using optical pumping, in particular pumping by a lamp or by another laser, thus making it possible to produce power lasers.

The invention is described in greater detail hereinafter relative to non-limitative embodiments and the attached drawings, wherein show:

FIG. 1 The absorption curve and light emission curve of an aluminate according to the invention, whose laser activator is the $V^{2+}$ ion.

Figure 2:
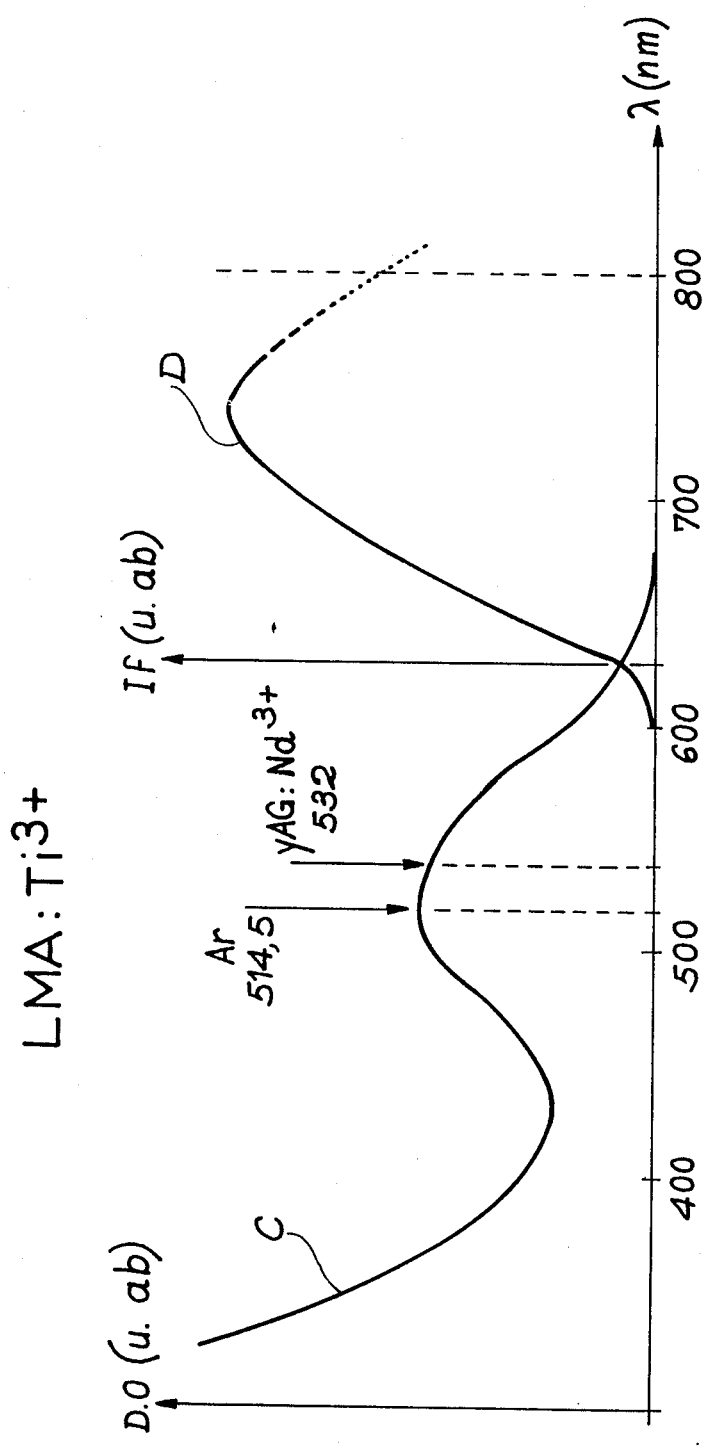

FIG. 2 The absorption curve and the fluorescence curve of an aluminate according to the invention, whose laser activator is the $Ti^{3+}$ ion.

Figure 3:
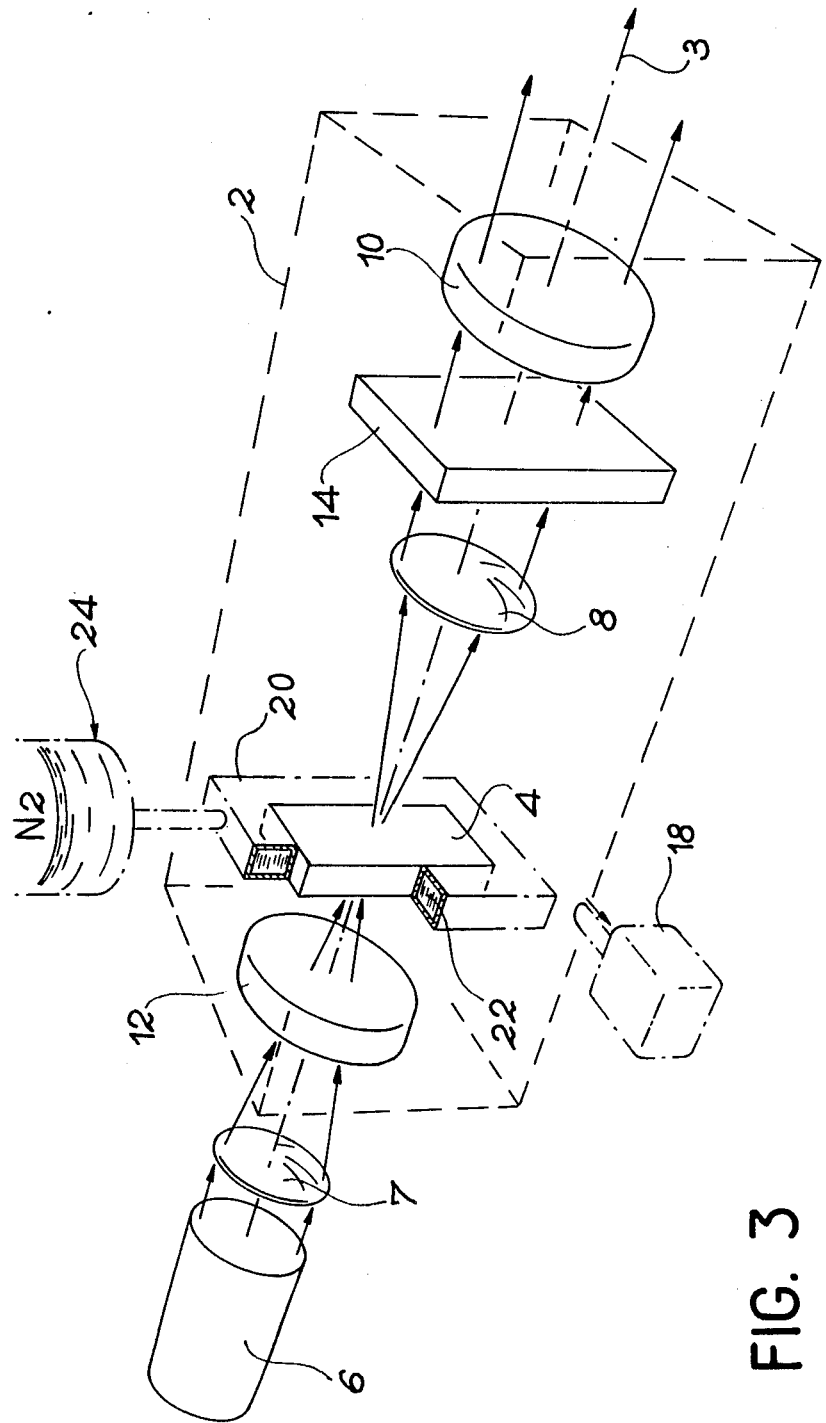

FIG. 3 Diagrammatically a continuous laser using an aluminate monocrystal according to the invention.

Figure 4:
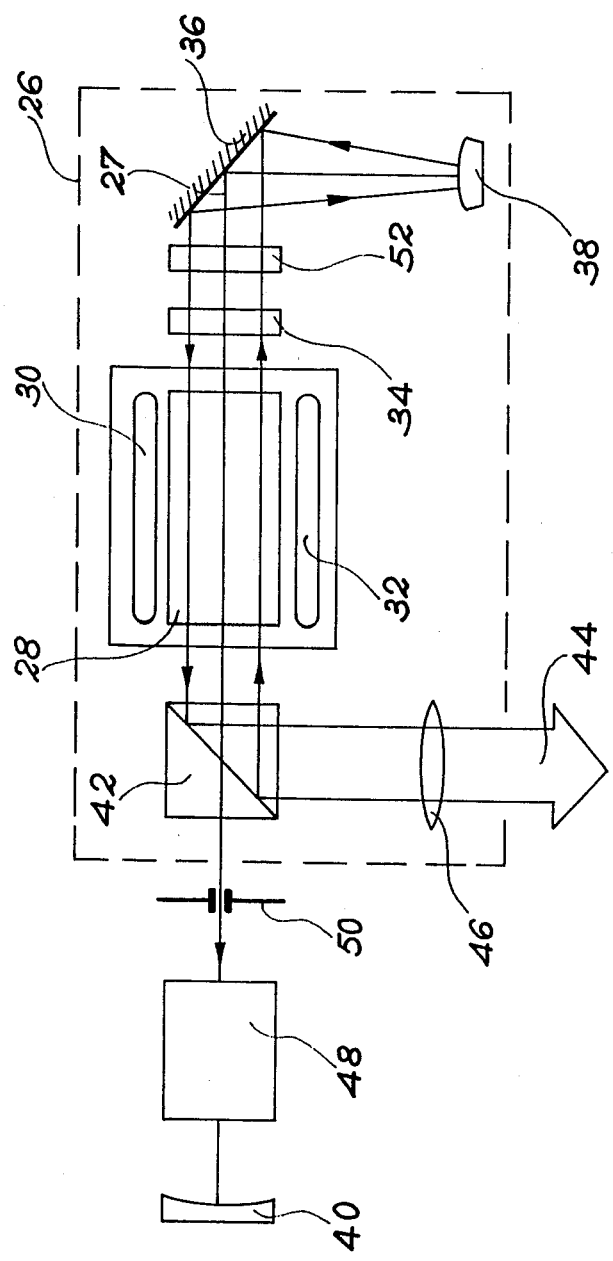

FIG. 4 Diagrammatically a pulsed powder laser using an aluminate monocrystal according to the invention.

A description will now be given of the production of mixed lanthanum-magnesium aluminates according to the invention and complying with formula (I). These aluminates are obtained by intimately mixing in the requisite proportions high purity commercially available powder of lanthanum trioxide ($La_2O_3$), magnesium oxide (MgO), aluminium oxide ($Al_2O_3$), vanadium dioxide $VO_2$ or vanadium pentaoxide $V_2O_5$, followed by calcining the mixture obtained at a temperature of 1500° C. After grinding the resulting product, a powder is obtained, which can then be treated with a view to producing a monocrystal.

This aluminate powder can also be obtained by the coprecipitation of hydroxides of lanthanum, magnesium, aluminium and vanadium. This coprecipitation is performed with ammonia in an aqueous solution or a non-aqueous solution, such as absolute alcohol containing a mixture of nitrates or chlorides of the different metal elements of the aluminate.

The nitrates or chlorides of magnesium and aluminium are commercially available, whilst the other nitrates or chlorides are obtained by dissolving the corresponding oxide respectively in nitric or hydrochloric acid.

The mixture obtained is then treated at 400° C. in a ventilated atmosphere up to dehydration and complete elimination of the ammonium chloride or nitrate, followed by calcining at a temperature of 1500° C. The powder obtained after grinding can then be treated with a view to producing a monocrystal.

The pulverulent oxides of the different elements used have a grain size ranging between 1 and 10 μm and a purity better than 99.99%, in order to obtain a maximum laser emission efficiency.

As a function of the degree of oxidation of the vanadium in the initial oxide, the aforementioned heat treatment can be followed by a second heat treatment in a reducing atmosphere, e.g. hydrogen, so that the vanadium passes from the pentavalent or tetravelent state into the divalent state. Vanadium is never introduced in form $V^{3+}$ into the molten bath.

Preferably, the monocrystals of the aluminates according to the invention are produced by Czochralski pulling. However, any other crystallogenesis method using a molten bath can be used, such as e.g. the floating zone method, the Bridgman method, the Verneuil method, the Kyropoulos method or the auto-crucible, etc. For example, a description will now be given of obtaining a monocrystal by Czochralski pulling.

The mixed aluminate powder obtained previously by coprecipitation or intimate mixing of the oxide, followed by heat treatment, is placed in an irridium crucible and then raised to its melting temperature equal to 1870° C., protected from atmospheric oxygen, so as to form a molten bath.

A monocrystalline nucleus of the same composition as the molten bath and cut parallel either to the crystallographic direction c, or to the direction a of the hexagonal mesh of the compound, is then brought into contact with the liquid bath and is slowly raised, whilst rotating on itself. Thus, the monocrystal is progressively formed at the end of the nucleus in the direction imposed by the latter.

Once the monocrystal has been produced, it can be annealed at a temperature equal to or greater than 1000° C. in a reducing atmosphere, e.g. hydrogen, in order to reduce the pentavalent, tetravalent or trivalent vanadium ions possibly present in the crystal into divalent vanadium ions, which induce stimulated emission tunable continuously between 1380 and 1800 nm.

In particular, this process made it possible to produce vanadium-dopoed lanthanum-magnesium aluminate monocrystals given in the following table I. In the upper part of table I is given the mass of the constituents of the bath expressed in grammes. In the left-hand lower part thereof is provided the composition of the crystal obtained, given in form x, y, z, t and u and in the lower right-hand part the formula of the monocrystal obtained. z and u do not appear in the table, because they are euqal to zero.

In table I, compounds 2 and 3 have a so-called congruent melting, for which the composition of the bath is very close to that of the crystal obtained.

In order to obtain titanium-doped lanthanum-magnesium aluminate monocrystals, the procedure adopted hereinbefore is again used, but the vanadium oxide is replaced by titanium (III) oxide. Moreover, due to the fact that the titanium is introduced into the bath in the trivalent state, it is not necessary to follow the annealing stage at 1500° C. by further annealing in a reducing atmosphere. However, annealing at 1000° C. in the presence of the hydrogen of the monocrystal formed is maintained.

It is also possible to form titanium-doped aluminates starting with $TiO_2$. In this case, the annealing stage under the reducing agent following calcining at 1500° C. can be performed in order to pass the titanium from the IV oxidation state to the III oxidation state, which is alone responsible for the laser effect.

Titanium-doped lanthanum-magnesium aluminate monocrystals have a continuously tunable stimulated emission between 650 and 1000 nm.

The following table II gives examples of the production of titanium-doped aluminate monocrystals. Table II is similar to table I, with the exception that v appears in place of t. In this table, compounds 5 to 8 have melting close to congruence.

The obtention of a zirconium-doped lanthanum-magnesium aluminate monocrystal can be prepared as hereinbefore, replacing the vanadium oxide by $ZrO_2$. Here again, the reduction stage after calcining at 1500° C. is necessary for passing the zirconium from the IV oxidation state to the III oxidation state, which is alone responsible for the laser effect.

The following table III gives examples of the production of aluminate monocrystals according to the invention containing zirconium as laser activators. Table III is similar to table II. Compound II has a near congruent melting.

Although z of the composition of the crystals does not appear in tables I to III, this value is slightly different from 0, but X-analysis with the scanning microscope did not make it possible to detect any significant variation of z from zero.

FIG. 1 shows the absorption spectrum and emission spectrum of the $V^{2+}$ ion in an aluminate of formula $La_{0.9}Mg_{0.45}V_{0.02}Al_{11.453}O_{19}$.

Curve A gives the optical density (OD) expressed in arbitrary units as a function of the wavelengths (λ), expressed in nanometers, whilst curve B gives the fluorescence intensity expressed in arbitrary units as a function of the wavelength.

The aluminate can be excited at one of the two wavelengths 532 nm and 1064 nm of a YAG:$Nd^{3+}$ exciting laser.

The vanadium aluminates according to the invention LMA:$V^{2+}$ have several wide absorption bands, thus permitting an easy excitation of the $V^{2+}$ ion.

Fluorescence detection was performed with a nitrogen-cooled germanium detector having its cutoff wavelength at 1700 nm, which did not make it possible to obtain the complete emission spectrum of LMA:$V^{2+}$. A priori, it would seem that the laser emission band of this aluminate is between 1380 and 1800 nm. This wide emission band permits the use of LMA:$V^{2+}$ in a continuously tunable laser.

FIG. 2 shows the absorption and emission spectra of the $Ti^{3+}$ ion in an aluminate according to the invention of formula $La_{0.9}Mg_{0.5}Al_{11.319}Ti_{0.114}O_{19}$ designated LMA:$Ti^{3+}$.

Curve C corresponds to the absorption and gives the optical density, expressed in arbitrary units, as a function of the wavelength expressed in nanometers, whilst curve D corresponds to the emission and gives the fluorescence intensity, expressed in arbitrary units, as a function of the wavelength.

LMA:$Ti^{3+}$ was excited at one of the following wavelengths: 514.5 nm from an argon laser or 532 nm from a YAG:$Nd^{3+}$ laser. This aluminate also has the advantage of a large absorption band thus facilitating $Ti^{3+}$ excitation. The emission curve was plotted with the air of a photomultiplier having a cutoff wavelength at about 800 nm, which did not make it possible to plot the complete emission curve. However, it can be estimated that the emission band of $Ti^{3+}$ extends from 650 to 1000 nm. This large emission band permits the use of LMA:$Ti^{3+}$ in a continuously tunable laser.

FIG. 3 diagrammatically shows a continuously tunable power laser using an aluminate monocrystal according to the invention. This laser comprises a laser cavity 2 containing an inventive aluminate bar 4 positioned perpendicular to the longitudinal axis 3 of the laser. For a laser emission between 650 and 1000 nm, bar 4 can be formed from aluminate of examples 7 or 8.

A monochromatic light source 6, such as a YAG:$Nd^{3+}$ laser, which is doubled in frequency, makes it possible to irradiate bar 4, via a convergent lens 7, in order to ensure its optical pumping. The laser cavity 2 also comprises a convergent lens 8, transforming the light emitted by the aluminate bar 4 into a parallel light beam, which is fed to an exit mirror 10. After reflection on mirror 10, the light beam again traverses the convergent lens 8 and then the amplifier medium or bar 4. The amplified laser beam is then reflected by a dichroic entrance mirror 12, which is transparent to the light emitted by the monochromatic source 6 and opaque to that emitted by the aluminate monocrystal 4.

A small part of the radiation reaching mirror 10 is transmitted by the latter and constitutes the laser emission out of cavity 2, mirror 10 being partly transpaent to the light emitted by monocrystal 4.

The wavelength tunability can be obtained with the aid of a wavelength selection system 14 placed between the convergent lens 8 and the exit mirror 10. This system is e.g. a Brewster angle prism or a birefringent filter.

To obtain a laser emission which is displaced slightly in the visible compared with the emission of the $Ti^{3+}$ ion (e.g. an emission between 600 and 900 nm), the $Ti^{3+}$-based bar 4 can be replaced by a LMA:$Zr^{3+}$ bar with the composition defined in example 11.

In the same way, in order to obtain a laser emission between 1380 and 1800 nm, it is possible to use as bar 4 a bar formed from a compound corresponding to the formula of examples 1 or 2.

The use of an aluminate, whose activator ion is $V^{2+}$, requires the use of a laser cavity 2 operating under vacuum. For this purpose, FIG. 3 shows a vacuum pump 18. Furthermore, laser emission can only be obtained at low temperature and in particular at the nitrogen liquefaction temperature of 77° K.

To this end, bar 4 is in contact with a cold support 20 containing liquid nitrogen 22, the filling of said support 20 taking place by means of a liquid nitrogen reservoir 24. In order not to occult the light from source 6 and that from bar 4, cold support 20 is in the form of a ring having a rectangular section having contact with all the lateral faces of bar 4.

The aluminates according to the invention can also be used in monocrystalline form in a power laser emitting in the form of pulses. To this end, FIG. 4 shows a pulsed power laser emitting in the near infrared. This pulsed laser comprises a cavity 26 containing a monocrystalline bar 28 of an aluminate according to the invention and positioned parallel to the longitudinal axis 27 of the laser. This aluminate has in particular the formula of examples 5, 6 or 10.

On either side of bar 28 are provided elongated, high intensity xenon flashlamps 30, 32, also oriented in accordance with laser axis 27. These lamps ensure a longitudinal optical pumping of the aluminate bar 28.

The laser cavity 26 also comprises a quarter wave plate 34 transforming said linearly polarized incident light from bar 28 into circularly polarized light. This plate is followed by a plane mirror 36 and a divergent convex mirror 38.

After reflection on mirror 38, the widened light beam, which is adapted and circularly polarized, again passes through the quarter wave plate 34, thus producing a vertically polarized beam, which completely sweeps the amplifier medium or bar 28, whilst extracting the maximum light energy therefrom.

The amplified laser beam propagating in the direction of another concave, highly reflecting mirror 40 is interrupted by a polarizer prism 42 ejecting the vertically polarized beam 44 out of the laser cavity. A convergent lens 46 makes it possible to obtain a parallel light beam.

This pulsed laser is equipped with a Q-switch between concave mirror 40 and exit polarizer 42. When this switch is closed, i.e. a voltage is applied thereto, the laser cannot operate. Thus, during the "pumping" of the amplifier medium 28 with lamps 30 and 32, polarizer 42 is transparent to horizontally polarized photons and allows the passage of light to switch 48. The latter rotates the polarization direction by 90° and prevents polarizer 42 from transmitting this light.

Conversely, on opening the Q-switch 48, the latter no longer alters the horizontal polarization from polarizer 42, so that it enables the laser cavity 26 to amplify the light from bar 28. A diaphragm 50 can be placed between the switch and the polarizer in order to channel the laser light.

The wavelength tunability is realized with a wavelength selection device 52, like that described hereinbefore and placed between plate 34 and mirror 36.

The aforementioned lasers have only been given in a nonlimitative manner and other laser types which can be equipped with a monocrystal of an aluminate according to the invention complying with formulas (I) and (II) can also be used. The monocrystals of aluminates according to the invention can in particular be used in lasers intended for cutting or marking materials, as well as for making welds.

The cutting of a material is e.g. ensured by placing a monocrystalline aluminate according to the invention in the cavity of a laser, as described hereinbefore, then orienting and focusing to the surface of the material the light from the laser, in order to bring this material locally to its melting point and thus ensure the cutting thereof, as it is moved in the laser beam.

The aluminates according to the invention can also be used for lasers used in the direction of gases and aerosols in the earth's atmosphere.

To this end, a monocrystalline bar of an aluminate according to the invention is placed in a laser cavity like that described hereinbefore. With the aid of a wavelength selector, the laser wavelength is determined which corresponds to an absorption band of the substance to be detected. The attenuation of the laser echo transmitted by an obstacle present in the atmosphere is a function of the quantity and nature of the chemical species present between the laser and said obstacle. This makes it possible to determine the quantity of gases and aerosols present in the earth's atmosphere, which can be of interest in the remote meterology field.

TABLE I

Production of Compounds of Formula
$La_{1-x}Mg_{1-y-t}V_tAl_{11+x+2y/3}O_{19}$

| | Mass of Constituents of Bath (g) | | | | |
|---|---|---|---|---|---|
| Example | $La_2O_3$ | MgO | $Al_2O_3$ | $V_2O_5$ | $VO_2$ |
| 1 | 76.404 | 24.308 | 385.973 | 6.093 | |
| 2 | 98.234 | 12.154 | 390.516 | 3.047 | |
| 3 | 99.325 | 11.344 | 388.364 | | 2.779 |
| 4 | 109.149 | 8.103 | 375.726 | | 11.114 |

| | Composition of Crystal Obtained | | | |
|---|---|---|---|---|
| Example | x | y | t | Formula of Crystal Obtained |
| 1 | 0.18 | 0.32 | 0.05 | $La_{0.82}$ $Mg_{0.63}$ $V_{0.05}$ $Al_{11.393}$ $O_{19}$ |
| 2 | 0.11 | 0.49 | 0.02 | $La_{0.89}$ $Mg_{0.49}$ $V_{0.02}$ $Al_{11.436}$ $O_{19}$ |
| 3 | 0.10 | 0.53 | 0.02 | $La_{0.90}$ $Mg_{0.45}$ $V_{0.02}$ $Al_{11.453}$ $O_{19}$ |
| 4 | 0.08 | 0.43 | 0.12 | $La_{0.92}$ $Mg_{0.43}$ $V_{0.12}$ $Al_{11.366}$ $O_{19}$ |

TABLE II

Production of Compounds of Formula
$La_{1-x}Mg_{1-y}Ti_vAl_{11+x+2y/3}O_{19}$

| | Mass of Constituents of Bath (g) | | | | |
|---|---|---|---|---|---|
| Example | $La_2O_3$ | MgO | $Al_2O_3$ | $Ti_2O_3$ | $TiO_2$ |
| 5 | 98.234 | 13.504 | 389.973 | 0.621 | |
| 6 | 98.234 | 13.504 | 374.838 | 1.252 | |
| 7 | 99.325 | 13.774 | 382.114 | 11.079 | |
| 8 | 99.325 | 13.774 | 384.163 | | 9.208 |
| 9 | 76.404 | 18.906 | 382.558 | | 5.353 |

TABLE II-continued

Production of Compounds of Formula
$La_{1-x}Mg_{1-y}Ti_vAl_{11+x+2y/3}O_{19}$

| | Composition of Crystal Obtained | | | |
|---|---|---|---|---|
| Example | x | y | v | Formula of Crystal Obtained |
| 5 | 0.11 | 0.49 | 0.06 | $La_{0.89}$ $Mg_{0.51}$ $Ti_{0.06}$ $Al_{11.436}$ $O_{19}$ |
| 6 | 0.11 | 0.54 | 0.12 | $La_{0.89}$ $Mg_{0.46}$ $Ti_{0.12}$ $Al_{11.470}$ $O_{19}$ |
| 7 | 0.10 | 0.50 | 0.114 | $La_{0.90}$ $Mg_{0.50}$ $Ti_{0.114}$ $Al_{11.319}$ $O_{19}$ |
| 8 | 0.10 | 0.50 | 0.086 | $La_{0.90}$ $Mg_{0.50}$ $Ti_{0.086}$ $Al_{11.347}$ $O_{19}$ |
| 9 | 0.18 | 0.42 | 0.05 | $La_{0.82}$ $Mg_{0.58}$ $Ti_{0.05}$ $Al_{11.460}$ $O_{19}$ |

TABLE III

Production of Compounds of Formula
$La_{1-x}Mg_{1-y}Zr_vAl_{11+x+2y/3}O_{19}$

| | Mass of Constituents of Bath (g) | | | |
|---|---|---|---|---|
| Example | $La_2O_3$ | MgO | $Al_2O_3$ | $ZrO_2$ |
| 10 | 98.234 | 13.504 | 388.808 | 4.128 |
| 11 | 99.325 | 13.774 | 371.525 | 44.58 |

| | Composition of Crystal Obtained | | | |
|---|---|---|---|---|
| Example | x | y | v | Formula of Crystal Obtained |
| 10 | 0.11 | 0.49 | 0.008 | $La_{0.89}$ $Mg_{0.51}$ $Zr_{0.008}$ $Al_{11.436}$ $O_{19}$ |
| 11 | 0.10 | 0.50 | 0.086 | $La_{0.90}$ $Mg_{0.50}$ $Zr_{0.086}$ $Al_{11.347}$ $O_{19}$ |

We claim:

1. A mixed lanthanum-magnesium aluminate, of the formula (I):

$$La_{1-x}Mg_{1-y-z-t}V_{t+u}Al_{11+x+2y/3-u}O_{19-z} \quad (I)$$

in which x represents a number such that $0<x<0.3$; y, z, t and u represent numbers such that $0<y+z+t\leq 1$ and $0<t+u\leq 1$ with $0<y<1$, $0<z<1$, $0<t\leq 1$ and $0\leq u<1$; said aluminate being single-phase and having the structure of magnetoplumbite.

2. Mixed aluminate according to claim 1, wherein x is such that $0.05\leq x\leq 0.2$.

3. Mixed aluminate according to claim 1, wherein y, z and t are such that $0.3\leq y+z+t\leq 0.6$.

4. Mixed aluminate according to claim 1, wherein u is equal to 0.

5. Mixed aluminate according to claim 1, wherein t is such that $0.02\leq t\leq 0.2$.

6. Mixed aluminate according to claim 1, wherein u is equal to 0, x is such that $0.05\leq x\leq 0.2$, t is such that $0.02\leq t\leq 0.2$ and y and t are such that $0.3\leq y+t\leq 0.6$.

7. A mixed lanthanum-magnesium aluminate, of the formula (II):

$$La_{1-x}Mg_{1-y-z}Mt_vAl_{11+x+2y/3-v}O_{19-z} \quad (II)$$

in which Mt represents a transition metal selected from the group consisting of titanium and zirconium; x represents a number such that $0<x<0.3$; y and z represent numbers such that $0\leq y+z\leq 1$ with $0\leq y\leq 1$ and and v represents a number such that $0\leq v\leq 1$; the aluminate being single-phase and having the structure of magnetoplumbite.

8. Mixed aluminate according to claim 7, wherein x is such that $0.05\leq x\leq 0.2$.

9. Mixed aluminate according to claim 7, wherein y and z are such that $0.3\leq y+z\leq 0.6$.

10. Mixed aluminate according to claim 7, wherein v is such that $0.004\leq v\leq 0.2$.

11. Mixed aluminate according to claim 7, wherein x is such that $0.05\leq x\leq 0.2$, y is such that $0.3\leq y\leq 0.6$, and v is such that $0.004\leq v\leq 0.2$.

* * * * *